United States Patent [19]
Donalson et al.

[11] Patent Number: 4,763,781
[45] Date of Patent: Aug. 16, 1988

[54] CONTAINER FOR PRINTED CIRCUIT BOARDS

[75] Inventors: Dennis C. Donalson; Robert R. Wilkie, both of Roanoke Rapids, N.C.

[73] Assignee: W.R. Grace & Co., Cryovac Div., Duncan, S.C.

[21] Appl. No.: 875,858

[22] Filed: Jun. 19, 1986

[51] Int. Cl.$^4$ .................... B65D 85/00; B65D 73/02
[52] U.S. Cl. .................... 206/334; 206/449; 211/41
[58] Field of Search ............ 206/334, 449, 328; 211/41

[56] References Cited
U.S. PATENT DOCUMENTS

| | | | |
|---|---|---|---|
| 4,426,675 | 1/1984 | Robinson et al. | 206/328 X |
| 4,427,114 | 1/1984 | Howell et al. | 206/334 |
| 4,494,651 | 1/1985 | Malcolm | 206/328 |
| 4,593,813 | 6/1986 | Powel | 206/328 |
| 4,664,265 | 5/1987 | George | 211/41 |

FOREIGN PATENT DOCUMENTS 2023102  12/1979  United Kingdom ............... 206/449

Primary Examiner—William Price
Attorney, Agent, or Firm—John J. Toney; William D. Lee, Jr.; Mark B. Quatt

[57] ABSTRACT

A storage container for electrostatic discharge sensitive devices comprises an enclosable polymeric outer shell, a polymeric inner shell disposed within the outer shell, grooves in the inner shell for accommodating electrostatic discharge sensitive devices, and means for affixing the inner shell to the outer shell.

9 Claims, 7 Drawing Sheets

CONTAINER FOR PRINTED CIRCUIT BOARDS

BACKGROUND OF THE INVENTION

The field of the present invention relates to portable containers for transporting devices sensitive to electrostatic discharge. More particularly, the field of the present invention includes containers which, while closed, protectively shield their contents from potentially harmful external electrical and electromagnetic forces.

Printed circuit boards are typically stored and carried in either conventional packaging, antistatic bags, or electrically conductive containers. To store a plurality of such boards, a carrying device is often used.

These carriers are often ribbed to provide slots for the insertion of each circuit board to be stored. Both injection molding and blow molding technology have been employed in producing such carrying means.

Containers have been developed, especially containers for portable use, as for example in the device replacement market, which protect electrically sensitive devices from damage. One type is a small box-like container that has conductive, sponge or foam sheets into which the device terminals are temporarily embedded. An example is found in U.S. Pat. No. 4,333,565.

A portable work station is described in U.S. Pat. No. 4,494,651 in which electrically conductive material such as carbon black particles, is blended with thermoplastic material to make an electrically conductive case.

With reference to carrying devices for storing a plurality of printed circuit boards or similar parts, British Patent No. GB2023102B describes a device including a plastic container with an insert made of plastic and comprising a rectangular frame with a series of parallel grooves and optionally dividers for storing printed circuit boards or similar parts.

A useful feature of such a device would be the capacity to safely and securely store a multiplicity of printed circuit boards and other electrostatic discharge (ESD) sensitive devices, while also providing a completely enclosed container which will protect such electrically sensitive devices from electrical and electromagnetic influence and mechanical abuse during distribution and storage of the contents.

A further advantage would be the use of relatively inexpensive blow molding technology to produce such a container. Unfortunately, close tolerances in compactly storing printed circuit boards and similar devices of relatively small dimensions are often difficult to achieve in a blow molding technology. While injection molding processes would meet these critical tolerances, such processe are considerably more expensive and complex.

It is therefore an object of the present invention to provide a relatively inexpensive container for carrying a plurality of printed circuit boards and other ESD sensitive devices.

It is also an object of the present invention to provide such a container which nevertheless meets the close tolerances required in storing such devices.

It is still another object of the present invention to provide such a container in which ESD sensitive devices such as printed circuit boards may be stored in a very compact arrangement so as to utilize a minimal volume of space.

It is yet another object of the present invention to provide a container for ESD sensitive devices in which the individual devices are protected to some extent from dimensional changes in the overall container created by external stress on the container.

SUMMARY OF THE INVENTION

In one aspect of the present invention, a storage container for electrostatic discharge sensitive devices comprises an enclosable polymeric outer shell; a polymeric inner shell disposed within the outer shell; grooves in the inner shell for accommodating electrostatic discharge sensitive devices; and means for affixing the inner shell to the outer shell.

In another aspect of the present invention, a method for storing electrostatic discharge sensitive devices comprises molding a top member, bottom member, two side members and two end members; connecting said members to form an enclosable shell; molding two side panels, each having a plurality of grooves along an interior surface therof, and two end panels; affixing a rigid support bracket to an exterior surface of each side panel; connecting said panels to form an inner shell; placing the inner shell within the enclosable shell; connecting the inner shell to the end members of said enclosable shell; and inserting the electrostatic discharge sensitive devices in corresponding grooves of the inner shell.

DEFINITIONS

The term "electrostatic discharge sensitive" is used herein to define devices which can be damaged by electrostatic discharge of between about 15,000 volts (or 100 microjoules energy) down to a few volts depending on the specific device and other factors.

The term "injection molding" is used herein to refer to a process of forming articles by softening granular or powdered plastics and forcing the softened material by a ram or screw into a mold.

The term "blow molding" is used herein to refer to a process of forming hollow articles by expanding a heated plastic element against the internal surfaces of a mold. Typically, a tube or parison is extruded between the open halves of a metal mold, and the mold is then closed to encompass a portion of the parison, and then air is injected through the walls of the parison.

BRIEF DESCRIPTION OF THE DRAWINGS

Further details are given below with reference to the drawings, wherein.

DESCRIPTION OF THE PREFERRED EMBODIMENTS

Figure 1:
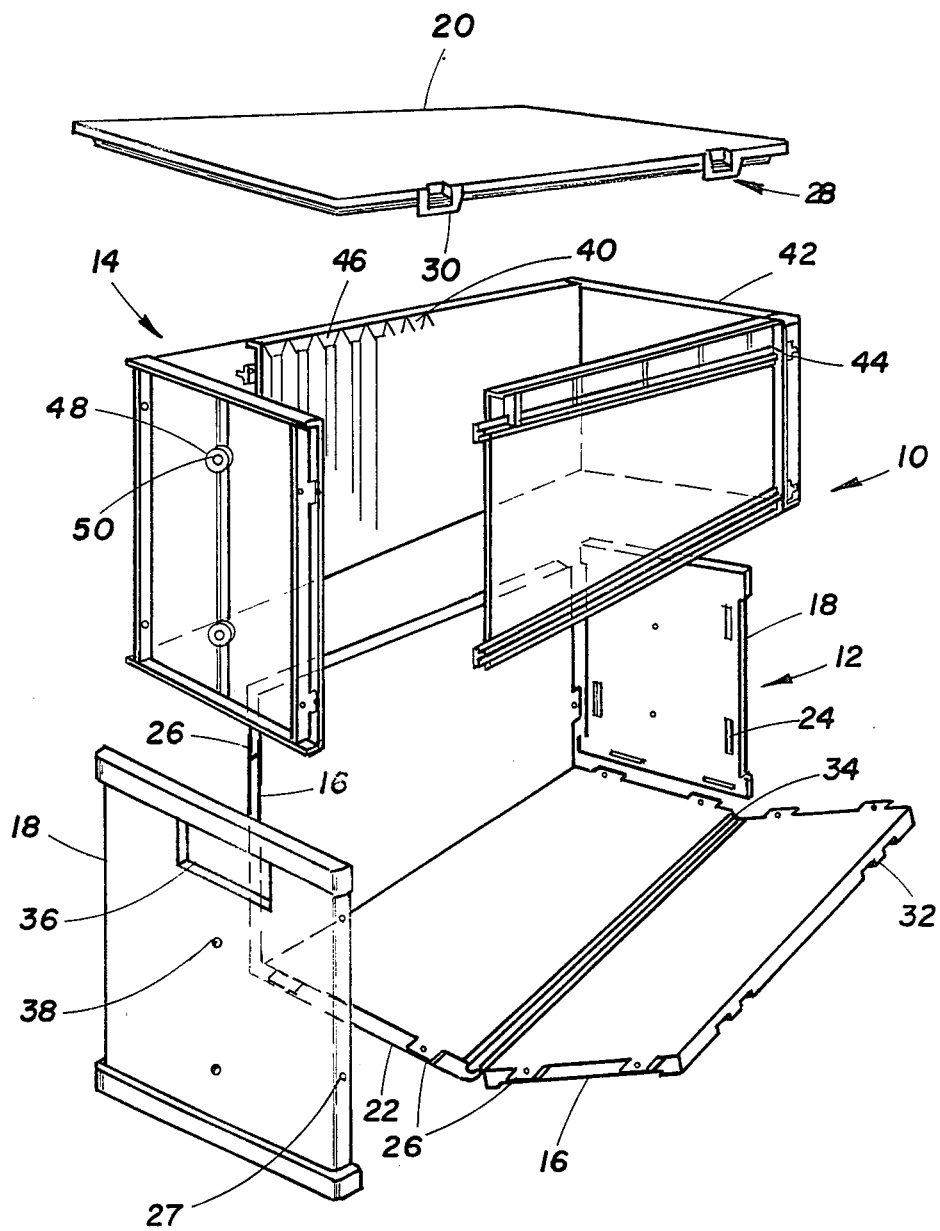
FIG. 1 is a perspective expanded view of an outer shell and inner shell in accordance with the present invention.

Referring to FIG. 1, the container 10 according to the present invention includes an outer shell 12 and an inner shell 14. The outer shell 12 can completely enclose and is therefore dimensionally somewhat larger in each dimension than inner shell 14.

Outer shell 12 includes side members 16 and end members 18, and a top member 20 and bottom member 22. The members are preferably individually blow molded and then assembled together. Indents 24 of end members 18 accommodate projections 26 of bottom member 22 and side members 16 to interlock the members into a single enclosure. Preferably, rivets or other suitable fasteners (not shown) are directed through apertures 27 to retain projections 26 within corresponding indents 24. Grooves (not shown) may optionally be provided at contiguous portions of the members to enhance the stability of outer shell 12. Latch means 28 located on the top edge of side members 16 and on the front and back edges of top members 20 include a latch 30 located on top member 20 and a corresponding boss 32 located on the top edge of side members 16. Such latching means are well known in the art. Preferably, a pair of latch means is utilized on each of the front and back side of the top member 20/side member 16 interface.

Side member 16 may be interlocked with bottom member 22 in various ways, including the latching means described above or by means of a hinge assembly 34 such as those well known in the art, e.g. integral hinges.

Figure 2:
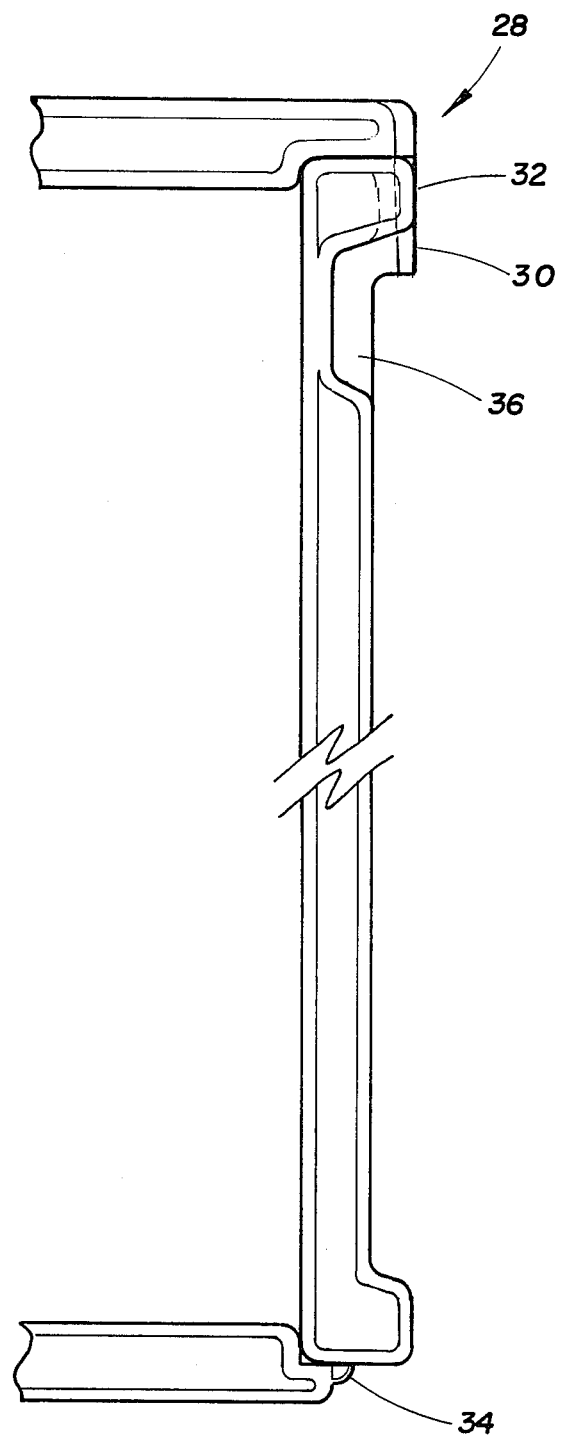
FIG. 2 is a sectional view of the latching means of the outer shell.

Finger recesses 36 may be included at the top central portion of the exterior side of side members 18, and may also be utilized at locations beneath the boss 32 of latch means 28, as best seen in FIG. 2.

FIG. 1 also illustrates inner shell 14 having side panels 40 and end panels 42. Support brackets 44 are suitably affixed to the exterior side of side panels 40 and provide rigid structural support for printed circuit boards placed in grooves 46 arranged on the interior surface of side panels 40 in parallel opposed fashion.

The grooves 46 are typically gauged to accommodate various standard sizes of printed circuit boards or similar electrostatic discharge sensitive devices. A typical width of each groove is about 0.125 inches. The grooves are preferably flared or widened out at the top of each of side panels 40 to permit easier insertion and removal of circuit boards. These flared portions also accommodate shrouds or other end pieces sometimes forming the end of a circuit board. End panels 42 include cylindrical members 48 having chambers 50 for insertion of suitable fastening means for affixing the completed inner shell 14 to the outer shell 12 through apertures 38 of end members 18. Suitable fastening means include bolts and the like.

Figure 3:
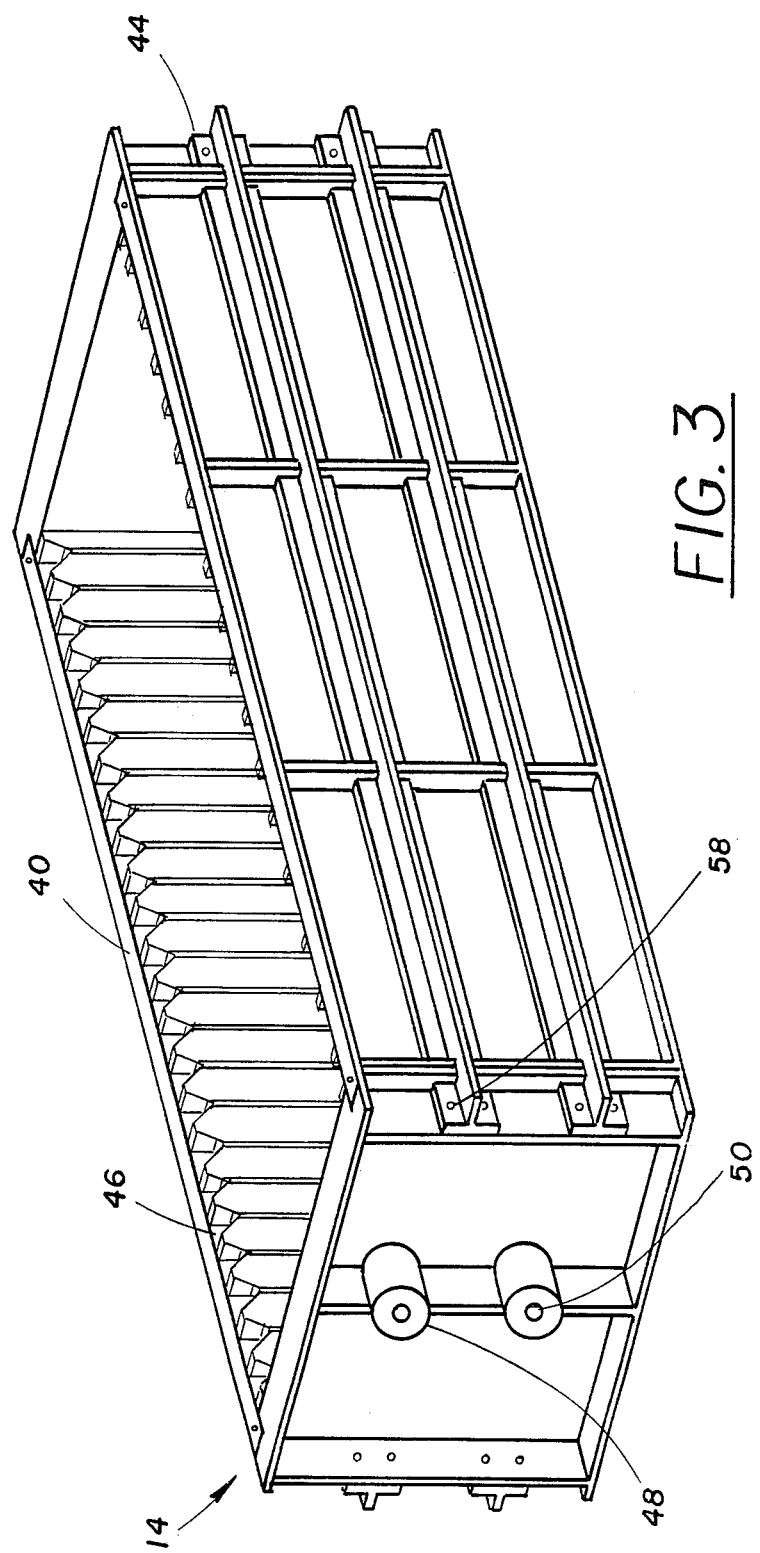
FIG. 3 is a perspective view of a preferred embodiment of the inner shell in accordance with the invention.

Referring to FIG. 3, a perspective view of an inner shell 14 is shown having some dimensional variation with the inner shell 14 illustrated in FIG. 1, but similar in function and construction. As most clearly seen in FIG. 3, grooves 46 are arranged in parallel, and preferable vertical fashion in rows along facing surfaces of side panels 40. Support brackets 44 located on the exterior face of each side panel 40 are preferably made from a metallic or other rigid material and preferably slidably inserted on the exterior surface of side panels 40 as shown to provide a rigid cage for the protection of the ESD sensitive devices during shipment and storage, and at times when stress is applied particularly in the longitudinal direction on the outer shell 12 of the container 10.

Figure 4:
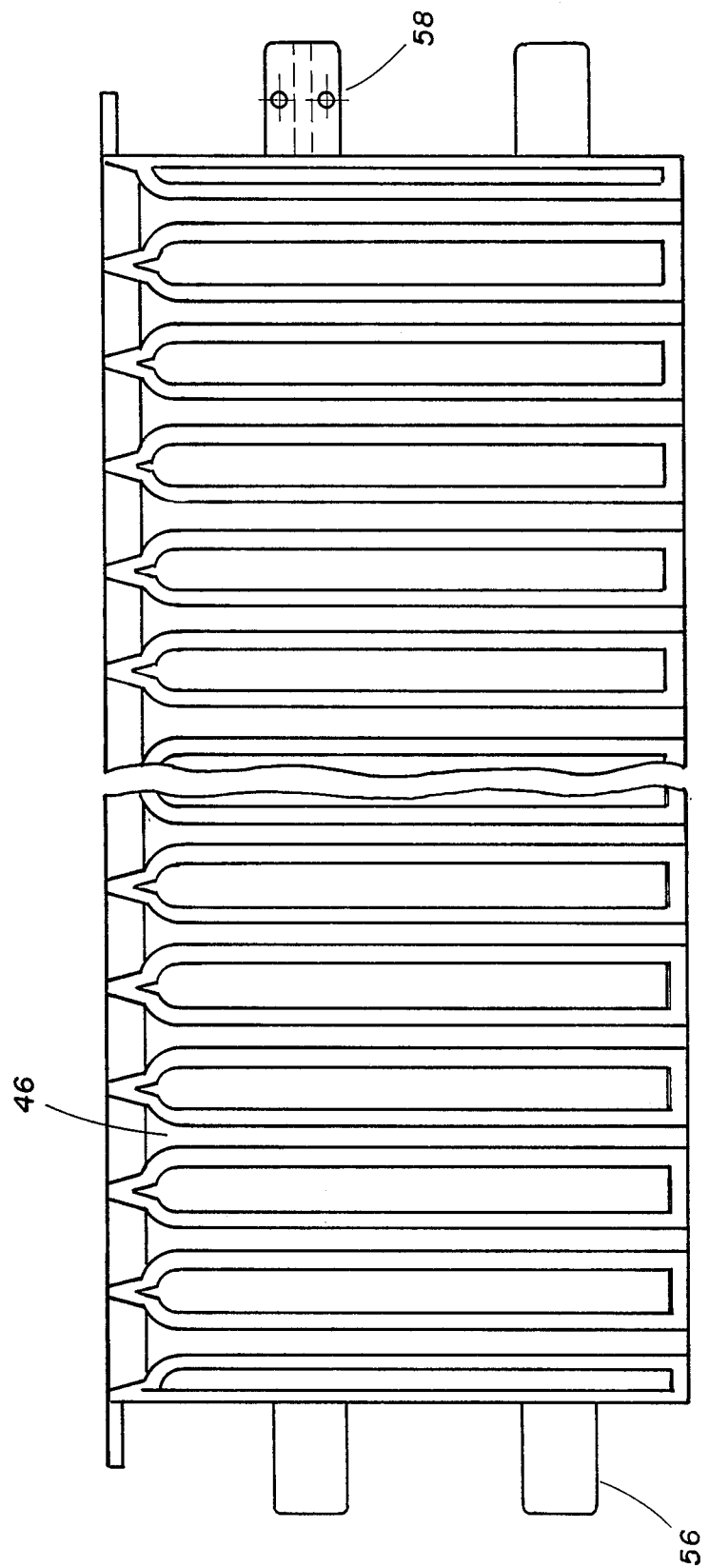
FIG. 4 is a side view of a grooved side panel of the interior shell.
Figure 5:
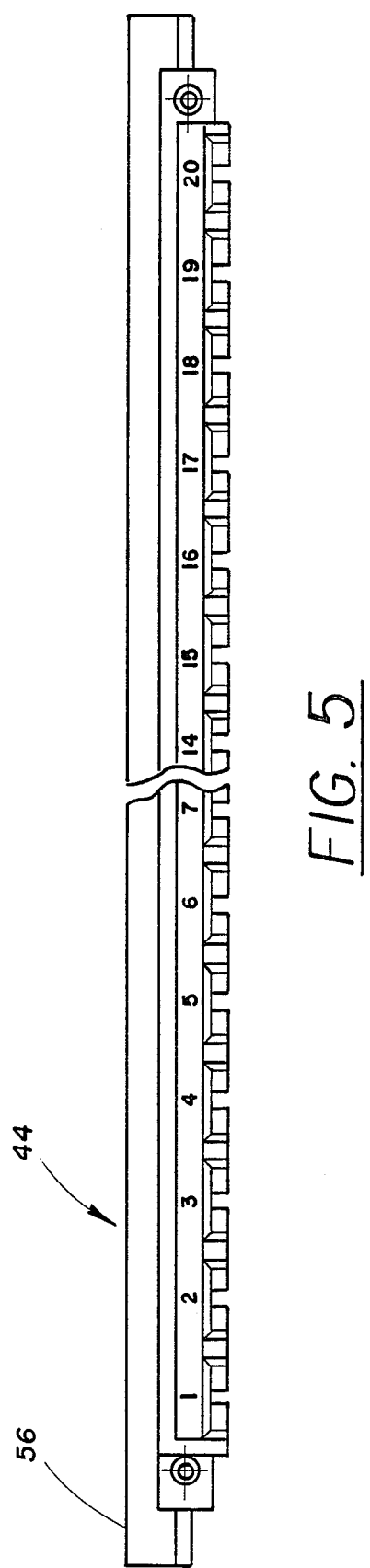
FIG. 5 is a plan view of the side panel of FIG. 4.
Figure 7:
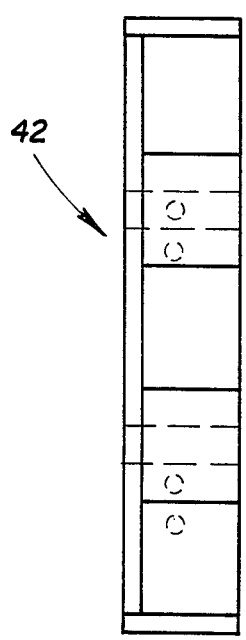
FIG. 7 is an end view of the end panel of FIG. 6.

FIGS. 4 and 5 further illustrate the relationship between the side panels 40 including the grooves 46, and the support bracket 44.

Figure 6:
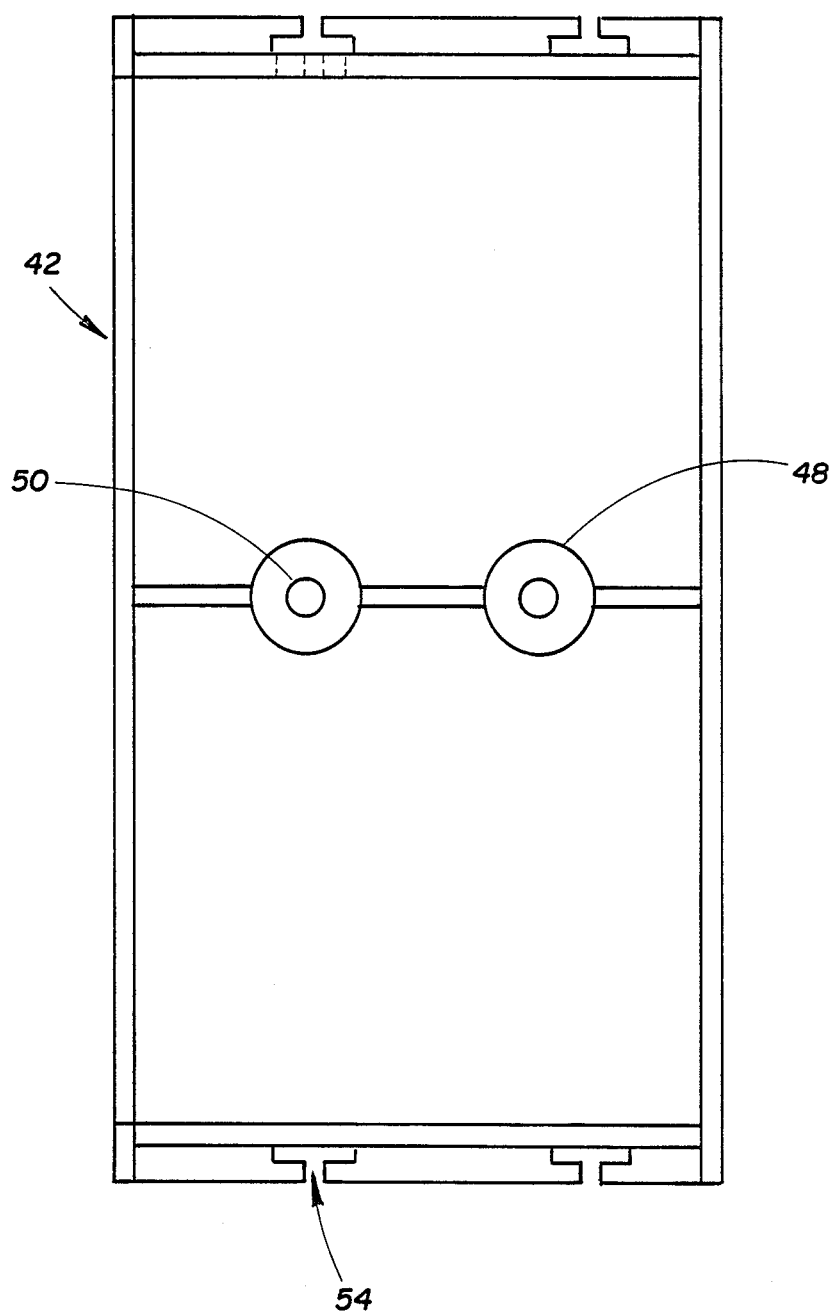
FIG. 6 is a side view of an end panel of the inner shell.

FIG. 6 illustrates a side view of end panel 42 having indents 54 on either side thereof. These indents correspond with bracket ends 56 (FIGS. 4 and 5) and provide an interlocking arrangement of the side panels 40 and end panels 42. Apertures 58 in bracket ends 56 can be used to attach the bracket ends 56 to respective end panels 42, using rivets or other suitable fastening means. Cylindrical members 48 having chambers 50 may then be fastened to end members 18 by means of apertures 38 to complete the construction of the container.

Preferably, the outer shell 12 is blow molded, and more preferably blow molded with a double wall construction, and made from a material that will provide an electrically conductive exterior. Blow molded containers of double wall construction are well known in the art. Such a container provides protection for ESD sensitive devices, and also protects the devices from mechanical abuse and stress during storage and distribution.

Because the inner shell 14 is separately constructed and installed, it need not be made by a blow molding process, and in fact is preferably made from an injection molding process which will provide closer tolerances for the grooves 46 to more securely accommodate and store ESD sensitive devices such as printed circuit boards.

Although the present invention has been described in connection with the preferred embodiments, one skilled in the art will understand that modifications may be made without departing from the scope of the invention.

What is claimed is:

1. A storage container for electrostatic discharge sensitive devices comprising:
   (a) an electrically conductive enclosable outer shell;
   (b) an injection-molded inner shell, smaller than the outer shell in each dimension;
   (c) grooves disposed on opposite facing surfaces of said inner shell for accommodating electrostatic discharge sensitive devices;
   (d) a support bracket affixed to the exterior side of the grooved facing surfaces of the inner shell; and
   (e) means for affixing the inner shell to the outer shell.

2. A container for storing printed circuit boards and similar articles comprising:
   (a) an electrically conductive exterior shell comprising two side members, two end members, a top member, and a bottom member, said members interconnected to form an enclosable shell;
   (b) an inner shell disposed within the enclosable shell and comprising two side panels and two end panels;
   (c) a support bracket affixed to the exterior surface of each side panel;
   (d) means for connecting the side panels to the end panels;
   (e) a plurality of grooves disposed on the interior surface of said side panels, said grooves of a width to accommodate said devices; and
   (f) means for connecting the inner shell to the end members of said exterior shell.

3. The container according to claim 2 wherein one of the side members includes means for pivoting with one edge of said bottom member.

4. The container according to claim 2 wherein said top member includes at one edge thereof means for latching with a corresponding stop located on one edge of one of the side members.

5. The container according to claim 2 wherein the two side panels of the inner shell are respectively parallel to and adjacent the two side members of the exterior shell.

6. The container according to claim 2 wherein the two end panels of the inner shell are respectively parallel to and adjacent the two end members of the exterior shell.

7. The container according to claim 2 wherein the means for connecting the side panels to the end panels comprises at least one extension disposed at each end of each support bracket, and mating indents at corresponding portions of each of the end panels to accommodate said extensions.

8. The container according to claim 2 wherein the grooves are parallel to each other in the plane of each respective side panel, and corresponding grooves in each side panel can accommodate an electrostatic discharge sensitive device.

9. The container according to claim 2 wherein the means for connecting the inner shell to the end members of the exterior shell comprises at least one cylindrical member affixed to each end panel and having a hollow chamber therein for maintaining a fastening means in communication with a corresponding aperture in each end member.

* * * * *